United States Patent
Shim et al.

[11] Patent Number: 5,858,860
[45] Date of Patent: Jan. 12, 1999

[54] METHODS OF FABRICATING FIELD ISOLATED SEMICONDUCTOR DEVICES INCLUDING STEP REDUCING REGIONS

[75] Inventors: Myoung-seob Shim; Won-taek Choi, both of Kyungki-do; Yun-seung Shin, Seoul, all of Rep. of Korea

[73] Assignee: Samsung Electronics Co., Ltd., Suwon, Rep. of Korea

[21] Appl. No.: 795,103

[22] Filed: Feb. 6, 1997

[30] Foreign Application Priority Data

Feb. 8, 1996 [KR] Rep. of Korea .................... 1996-3063

[51] Int. Cl.⁶ ........................................................ H01L 2/76
[52] U.S. Cl. ........................ 438/439; 438/699; 438/692; 438/978
[58] Field of Search .................. 438/439, 697, 438/443, 978, 229, 699, 692

[56] References Cited

U.S. PATENT DOCUMENTS 4,610,078  9/1986  Matsukawa et al. .
5,506,168  4/1996  Morita et al. .
5,554,560  9/1996  Hsue et al. .
5,672,538  9/1997  Liaw et al. .

FOREIGN PATENT DOCUMENTS 4-150030  5/1992  Japan .
4-177724  6/1992  Japan .
4-213828  8/1992  Japan .
5-82515   4/1993  Japan .

*Primary Examiner*—George Fourson
*Attorney, Agent, or Firm*—Myers Bigel Sibley & Sajovec

[57] ABSTRACT

Isolated semiconductor devices are formed by forming field oxide regions in a face of a semiconductor substrate to define active regions therebetween. The field oxide regions extend to above the substrate face and include an oblique surface which extends from above the substrate face to the substrate face. A step reducing region is formed on a respective one of the oblique surfaces of the field oxide regions, extending onto the active regions at the substrate face. The step reducing region can reduce the steepness of the step between the substrate face and the field oxide regions, thereby facilitating further processing and reliability of the semiconductor devices.

9 Claims, 4 Drawing Sheets

METHODS OF FABRICATING FIELD ISOLATED SEMICONDUCTOR DEVICES INCLUDING STEP REDUCING REGIONS

FIELD OF THE INVENTION

This invention relates to semiconductor devices and fabrication methods therefor, and more particularly to field isolated semiconductor devices and fabrication methods therefor.

BACKGROUND OF THE INVENTION

Integrated circuit devices generally include many active devices such as transistors, diodes or the like in a semiconductor substrate. Field isolation regions are generally used to isolate the active devices from one another.

It is generally known to form field oxide regions in a face of a semiconductor substrate using local oxidation of silicon (LOCOS) methods. Unfortunately, conventional LOCOS methods may form a bird's beak at the boundary between the field oxide region and the active region of the substrate. The bird's beak may reduce the area of the active region, may be difficult to control, and may cause crystal defects in the substrate due to differences in the thermal expansion coefficients.

In order to reduce or eliminate some of these problems, it has been proposed to perform local oxidation of silicon after first forming a patterned pad insulation layer using a thin film of silicon dioxide or silicon oxynitride. The use of a pad insulation layer may reduce or eliminate the formation of a bird's beak.

Unfortunately, the pad insulation layer may produce a sharp slope at the edge of the field oxide layer relative to the substrate surface of the active region. This sharp slope may generate a steep step which may adversely impact subsequent microelectronic fabrication processes and which may degrade the reliability of the semiconductor device. For example, the steep step may adversely affect a subsequent gate insulation layer and subsequent gate forming processes of field effect transistors.

A conventional isolation method for a semiconductor device and the problems caused thereby will now be described in detail with reference to FIGS. 1A–1D. Referring now to FIG. 1A, a pad insulation layer 15 and an oxidation preventing layer 20 are sequentially formed on the face of a substrate 10. The pad insulation layer 15 is preferably a thin film which prevents bird beak formation during subsequent oxidation, and which may be formed of silicon oxynitride.

Referring now to FIG. 1B, an opening 25 is formed to thereby produce patterned oxidation preventing layer 20a and patterned pad insulation layer 15a. Thus, the patterned oxidation preventing layer 20a and the patterned pad insulation layer 15a remain in the active region of the substrate 10 but are removed from the isolation region thereof.

As shown in FIG. 1C, the substrate 10 is oxidized to form a field oxide region 30 in the face of the semiconductor substrate 10. The field oxide region 30 extends above the substrate face and includes an oblique surface which extends from above the substrate face to the substrate face. As shown, the patterned pad insulation layer 15a reduces or prevents generation of a bird's beak.

Then, as shown in FIG. 1D, the patterned oxidation preventing layer 20a and the patterned pad insulation layer 15a are removed to expose the active region of the substrate 10.

Unfortunately, as illustrated in FIG. 1D, the angle $\theta_1$ of the field oxide layer 30 with respect to the substrate surface is increased, thereby resulting in a steep step. The steep step may prevent uniform coverage of subsequent layers and may otherwise degrade subsequent processes and structures.

SUMMARY OF THE INVENTION

It is therefore an object of the present invention to provide isolation methods for semiconductor devices which can reduce the steep step between the field oxide layer and the substrate surface of the active region.

It is another object of the present invention to provide field isolated semiconductor substrates which can reduce the steep step between the field oxide layer and the substrate surface of the active region.

These and other objects are provided, according to the present invention, by isolation methods for semiconductor devices which form a step reducing region on a respective one of the oblique surfaces of the field oxide regions and which extend onto the active regions at the substrate face. The step reducing region, which is preferably an insulating step reducing region, defines a second angle with the substrate face which is greater than a first angle which is defined between the oblique surface of the field oxide regions and the substrate face. By reducing the step, subsequent processing may be made more uniform and reliability of the devices may be increased.

In particular, according to the invention, field oxide regions are formed in a face of semiconductor substrate to define active regions therebetween. The field oxide regions extend above the substrate face and include an oblique surface which extends from above the substrate face to the substrate face. A step reducing region is formed on a respective one of the oblique surfaces of the field oxide regions, extending onto the respective active region at the substrate face.

The step of forming step reducing regions preferably comprises the steps of forming a patterned masking layer on the active regions which is spaced apart from the field oxide regions. An insulating layer is formed on the field oxide regions and on the active regions between the patterned masking layer and the field oxide regions. The patterned masking layer is removed and the insulating layer is etched to form the step reducing region on a respective one of the oblique surfaces of the field oxide regions, extending onto the respective active region at the substrate face.

An embodiment of isolation methods of the present invention sequentially forms a patterned pad isolation layer and a patterned oxidation preventing layer on a face of a semiconductor substrate to define field regions therebetween. The field regions are oxidized to form field oxide regions in the substrate face, which extend above the substrate face and include an oblique surface which extends from above the substrate face to the pad insulation layer. The oxidation preventing layer is further patterned so that it is spaced apart from the field oxide regions. An insulating layer is formed on the field oxide regions, on the oxidation preventing layer, and between the oxidation preventing layer and the field oxide regions. The oxidation preventing layer and the patterned pad insulation layer are removed between the oxidation preventing layer and the substrate face. The insulating layer is then etched to form step reducing regions which extend from the pad insulating layer onto the oblique surfaces of the field oxide regions.

Prior to removing the oxidation preventing layer, the insulating layer may be etched back to expose the patterned pad insulating layer. Chemical mechanical polishing may be used. The step of etching the insulating layer may be performed by partially wet etching the insulating layer to form the step reducing regions which extend from the pad insulating layer onto the oblique surfaces of the field oxide regions.

Field isolated semiconductor substrates according to the invention include a plurality of field oxide regions in a face of the semiconductor substrate which define active regions therebetween. The field oxide regions extend above the substrate face and include an oblique surface which extends from above the substrate face to the substrate face. A step reducing region is included on a respective one of the oblique surfaces of the field oxide regions, extending onto the active regions at the substrate face. The step reducing region is preferably an insulating step reducing region. The oblique surface and the substrate face preferably define a first angle and the step reducing region and the substrate face define a second angle which is greater than the first angle. Step height is thereby reduced.

The step reducing regions preferably comprise a pad insulation layer which extends on the substrate face from the field oxide region to on the active region, and an insulating layer which extends from on the pad insulation layer onto the oblique surface of the field oxide region. The pad insulation layer preferably comprises silicon oxynitride. The insulating layer preferably comprises material selected from the group consisting of high temperature oxide, borophosphosilicate glass, phosphosilicate glass and undoped silicate glass.

DETAILED DESCRIPTION OF PREFERRED EMBODIMENTS

Figure 1A:
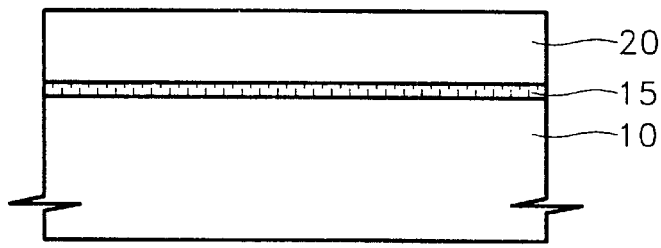
FIGS. 1A–1D are cross-sectional views of a conventional field isolated semiconductor substrate during intermediate processing steps.
Figure 1B:
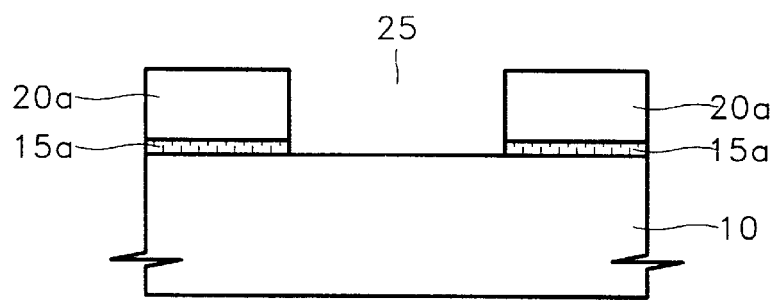
Figure 1C:
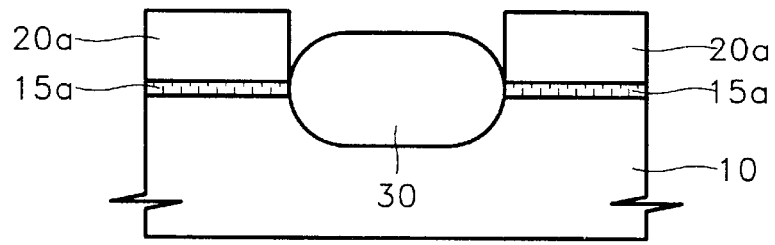

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, each embodiment described and illustrated herein includes its complementary conductivity embodiment as well. It will also be understood that when a layer is referred to as being "on" another layer or substrate, it can be directly on the other layer or substrate, or intervening layers may also be present.

Figure 2A:
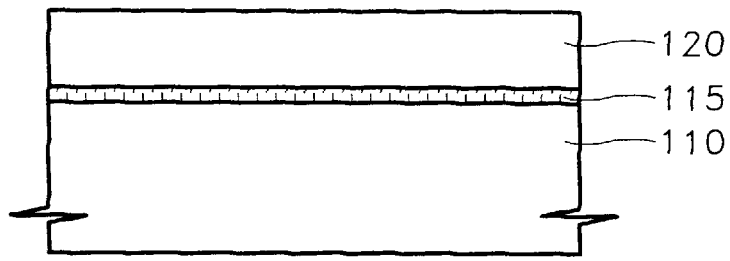
FIGS. 2A–2H are cross-sectional views of a field isolated semiconductor substrate according to the present invention during intermediate fabrication steps.

Referring now to FIG. 2A, a pad insulation layer and an oxidation preventing layer are sequentially formed on a substrate. In particular, the pad insulation layer 115 is formed on the substrate 110 and then the oxidation preventing layer 120 is formed on the pad insulation layer 115. The pad insulation layer 115 may be a thin film which can prevent a bird's beak from being generated during subsequent oxidation processes. For example, a film of 160 Å in thickness may be formed. Pad insulation layer 115 is preferably silicon oxynitride. Oxidation preventing layer 120 may be formed of nitride and is preferably substantially thicker than the pad insulation layer. For example, it may have a thickness of about 1500 Å. Alternatively, pad insulation layer 115 may have a thickness of less than 100 Å, for example about 60 Å, using a conventional stress buffering oxide layer.

Figure 2B:
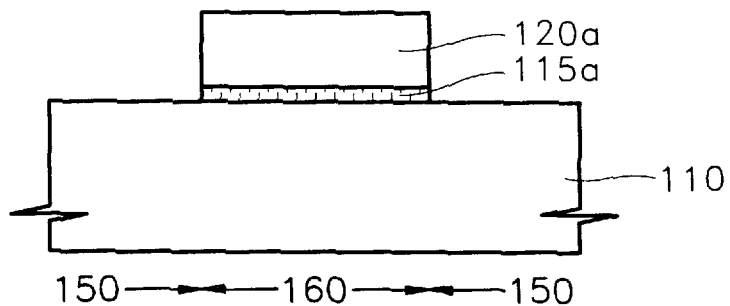

As shown in FIG. 2B, a masking layer is formed on the active regions. In particular, oxidation preventing layer 120 is patterned to form patterned oxidation preventing layer 120a, and pad insulation layer 115 is patterned to form patterned pad insulation layer 115a. Accordingly, patterned oxidation preventing layer 120a and patterned pad insulation layer 115a remain in the active region 160 of the substrate 110 and are removed from the field region 150.

Figure 2C:
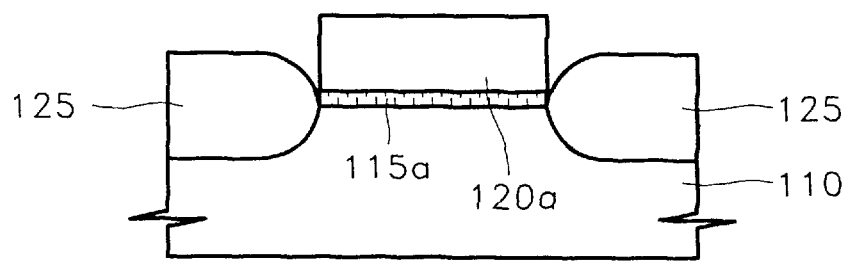

Then, as shown in FIG. 2C, a field oxide layer 125 is formed. Specifically, the oxidation preventing layer pattern 120a is used as a mask to oxidize the exposed substrate and thereby form field oxide layer 125. The field oxide layer 125 may have a thickness of about 3500 Å. As shown, field oxide regions are formed in the face of the semiconductor substrate to define the active regions therebetween. The field oxide regions extend above the substrate face and include an oblique surface which extends from above the substrate face to the substrate face.

Figure 2D:
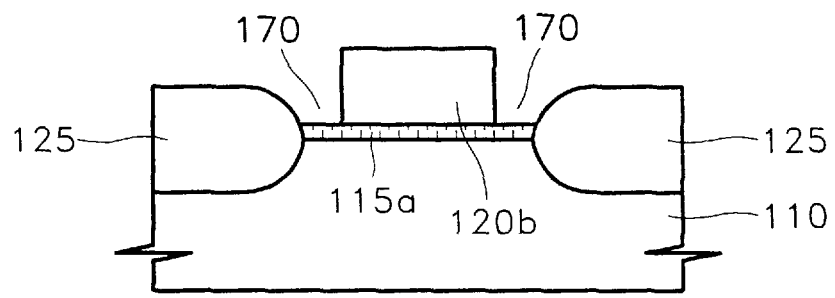

Referring now to FIG. 2D, the oxidation preventing layer pattern 120a is further patterned to form patterned oxidation preventing layer 120b which is spaced apart from the field oxide regions 125. Stated differently, part of the patterned pad insulation layer 115a is exposed.

The portions of the patterned oxidation preventing layer 120a may be removed by wet etching using phosphoric acid solution ($H_3PO_4$). The width of the exposed edge portions 170 of the pad insulation pattern 115 is about 200 Å. Stated differently, the further patterned oxidation preventing layer 120b is spaced apart from the field oxide regions by about 200 Å.

Figure 2E:
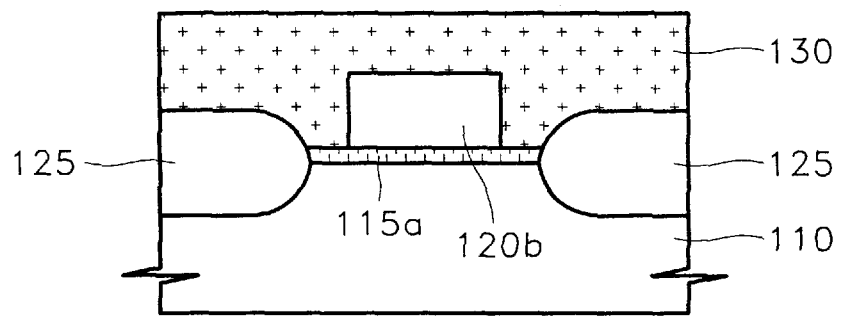

Referring now to FIG. 2E, an insulating layer is formed on the field oxide regions 125, on the oxidation preventing layer 120b and between the oxidation preventing layer and the field oxide regions (exposed edge portions 170). More specifically, a chemical vapor deposition (CVD) may be performed on the entire surface of the substrate of FIG. 2D to form insulating layer 130. The insulating layer 130 is preferably formed of a high temperature oxide layer (HTO) of a thickness of about 2500 Å. Alternatively, the insulating layer may be formed of borophosphosilicate glass (BPSG), phosphosilicate glass (PSG) and undoped silicate glass (USG).

Figure 2F:
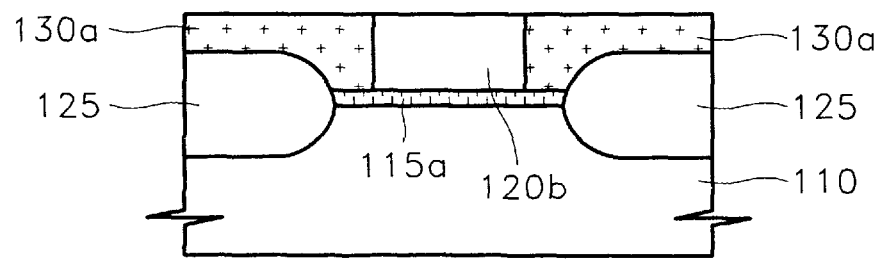

Referring now to FIG. 2F, the insulating layer 130 is etched back to expose the patterned pad insulating layer 120b. The etching back may be performed using chemical mechanical polishing (CMP) or dry etching or other conventional processes.

Figure 2G:
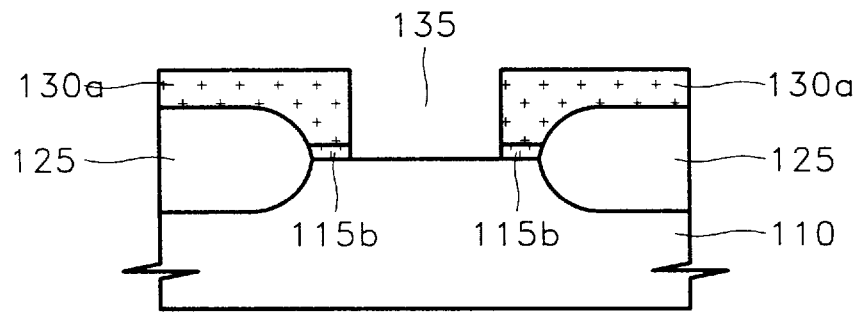

Referring now to FIG. 2G, the oxidation preventing layer and the patterned pad insulation layer are removed between the oxidation preventing layer and the substrate face. More specifically, an opening 135 is formed which exposes the active region of the substrate 110. Reference numeral 115b represents the pad insulation layer which remains after the etch back process. The opening 135 may be formed by wet etching to thereby remove the oxidation preventing layer pattern 120b of FIG. 2F and the underlying portion of the pad insulation layer pattern 115a of FIG. 2F. The active region 160 is thereby exposed.

Figure 1D:
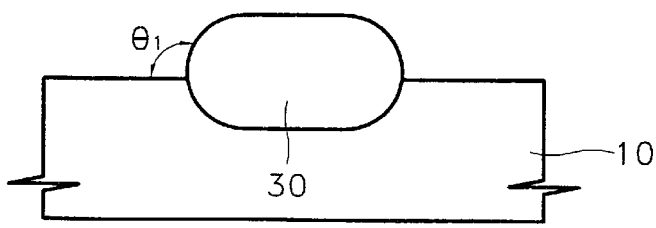
Figure 2H:
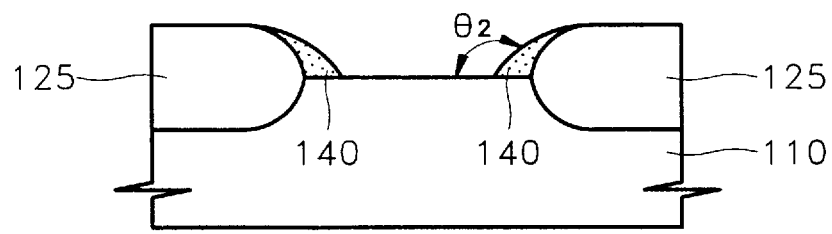

Referring now to FIG. 2H, the insulating layer is then etched to form step reducing regions which extend from the pad insulating layer onto the oblique surfaces of the field oxide regions. In particular, the insulating layer 130a is partially wet etched to form the step reducing regions. More specifically, referring to FIG. 2H, an etch is performed to reduce the step height of the edge of the field oxide layer 125. Reference numeral 140 indicates the step reducing pattern which is formed by partially etching the insulating layer 130a. As shown in FIG. 2H, angle $\theta_2$ between the substrate face and the step reducing pattern 140 is greater than the angle $\theta_1$ between the field oxide region 125 and the substrate face (as illustrated in FIG. 1D).

As shown, the step reducing regions 140 are formed by removing the etch back insulation layer 130a of FIG. 2G and the remaining pad insulation layer pattern 115b of FIG. 2G to a thickness of about 100 Å by wet etching. Accordingly, the step reducing region 140 comprises a pad insulation layer 115b which extends on the substrate face from the field oxide region to over the active region and an insulating layer 130a which extends from on the pad insulation layer onto the oblique surface of the field oxide region. The insulating layer is formed from the etched back insulation layer 130a and the pad insulation layer is formed from the pad insulation layer 115b of FIG. 2G.

Accordingly, methods and structures of the present invention can reduce the steepness of the step or angle between the substrate surface and the field oxide layer. By reducing the steepness of the step, subsequent processing may be facilitated.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An isolation method for a semiconductor device comprising the steps of:

forming field oxide regions in a face of a semiconductor substrate to define active regions therebetween, the field oxide regions extending above the substrate face and including an oblique surface which extends from above the substrate face to the substrate face; and forming a step reducing region on a respective one of the oblique surfaces of the field oxide regions, extending onto the respective active regions at the substrate face, by performing the following steps:

forming a patterned masking layer on the active regions, which is spaced apart from the field oxide regions;

forming an insulating layer on the field oxide regions and on the active regions between the patterned masking layer and the field oxide regions;

removing the patterned masking layer; and etching the insulating layer to form the step reducing region on a respective one of the oblique surfaces of the field oxide regions, and extending onto the respective active regions at the substrate face.

2. An isolation method for a semiconductor device comprising the steps of:

sequentially forming a patterned pad insulation layer and a patterned oxidation preventing layer on a face of a semiconductor substrate to define field regions therebetween;

oxidizing the field regions to form field oxide regions in the substrate face which extend to above the substrate face and which include an oblique surface which extends from above the substrate face to the pad insulation layer;

further patterning the patterned oxidation preventing layer so that it is spaced apart from the field oxide regions;

forming an insulating layer on the field oxide regions, on the further patterned oxidation preventing layer and between the further patterned oxidation preventing layer and the field oxide regions;

removing the further patterned oxidation preventing layer and the patterned pad insulation layer between the further patterned oxidation preventing layer and the substrate face; and etching the insulating layer to form step reducing regions which extend from the pad insulating layer onto the oblique surfaces of the field oxide regions.

3. An isolation method according to claim 2 wherein the following step is performed between the steps of forming an insulating layer and removing the further patterned oxidation preventing layer and the patterned pad insulation layer:

etching back the insulating layer to expose the patterned pad insulating layer.

4. An isolation method according to claim 2 wherein the step of etching the insulating layer comprises the step of:

partially wet etching the insulating layer to form step reducing regions which extend from the pad insulating layer onto the oblique surfaces of the field oxide regions.

5. An isolation method according to claim 2 wherein the pad insulation layer comprises silicon oxynitride.

6. An isolation method according to claim 2 wherein the insulation layer comprises material selected from the group consisting of high temperature oxide, borophosphosilicate glass, phosphosilicate glass and undoped silicate glass.

7. An isolation method according to claim 3 wherein the etching back step comprises the step of:

chemical-mechanical polishing the insulating layer to expose the patterned pad insulating layer.

8. An isolation method according to claim 1 wherein the step of forming a step reducing region comprises the step of forming an insulating step reducing region.

9. An isolation method according to claim 1 wherein the oblique surface and the substrate face define a first angle and wherein the step reducing region and the substrate face define a second angle which is greater than the first angle.

* * * * *